(12) United States Patent
Wu et al.

(10) Patent No.: US 12,349,501 B2
(45) Date of Patent: Jul. 1, 2025

(54) PHOTOVOLTAIC CELL AND PHOTOVOLTAIC MODULE (71) Applicant: LONGI GREEN ENERGY TECHNOLOGY CO., LTD., Shaanxi (CN)

(72) Inventors: Zhao Wu, Shaanxi (CN); Chen Xu, Shaanxi (CN); Zifeng Li, Shaanxi (CN); Junjie Xie, Shaanxi (CN)

(73) Assignee: LONGI GREEN ENERGY TECHNOLOGY CO., LTD., Shaanxi (CN)

( * ) Notice: Subject to any disclaimer, the term of this patent is extended or adjusted under 35 U.S.C. 154(b) by 0 days.

(21) Appl. No.: 18/036,583

(22) PCT Filed: Nov. 18, 2021

(86) PCT No.: PCT/CN2021/131407
§ 371 (c)(1),
(2) Date: May 11, 2023

(87) PCT Pub. No.: WO2022/105821
PCT Pub. Date: May 27, 2022

(65) Prior Publication Data
US 2024/0014333 A1    Jan. 11, 2024

(30) Foreign Application Priority Data
Nov. 18, 2020 (CN) .......................... 202011296656.4

(51) Int. Cl.
*H01L 31/02* (2006.01)
*H01L 31/18* (2006.01)
(Continued)

(52) U.S. Cl.
CPC ......... *H10F 77/215* (2025.01); *H10F 71/129* (2025.01); *H10F 77/703* (2025.01)

(58) Field of Classification Search
CPC ....... H01L 31/022433; H01L 31/02363; H01L 31/1868
See application file for complete search history.

(56) References Cited

U.S. PATENT DOCUMENTS 6,156,968 A    12/2000 Nishimoto et al.
2007/0084505 A1    4/2007 Zaidi
(Continued)

FOREIGN PATENT DOCUMENTS

CN    102610692 A    7/2012
CN    103035769 A    4/2013
(Continued)

OTHER PUBLICATIONS

International Search Report for Application No. PCT/CN2021/131407, mailed Feb. 9, 2022 (4 pages).
(Continued)

*Primary Examiner* — Jayne L Mershon
(74) *Attorney, Agent, or Firm* — NIXON PEABODY LLP; Jeffrey L. Costellia (57) ABSTRACT

At least one surface of a cell body of a photovoltaic cell includes a first area and a second area; the first area is configured as a textured structure; the second area is configured as a plurality of pits having a projection size of 0.5 to 100 microns on the surface of the cell body.

18 Claims, 3 Drawing Sheets

(51) Int. Cl.
*H10F 71/00* (2025.01)
*H10F 77/20* (2025.01)
*H10F 77/70* (2025.01)

(56) References Cited

U.S. PATENT DOCUMENTS

| | | | | |
|---|---|---|---|---|
| 2014/0370643 | A1* | 12/2014 | Stern | H01L 31/02363 |
| | | | | 252/79.3 |
| 2015/0037923 | A1 | 2/2015 | Tarasov et al. | |
| 2015/0096614 | A1 | 4/2015 | Yang | |
| 2017/0236953 | A1 | 8/2017 | Dutta | |
| 2018/0366597 | A1* | 12/2018 | Carlson | H01L 31/0747 |
| 2019/0019901 | A1* | 1/2019 | Li | H01L 31/022408 |

FOREIGN PATENT DOCUMENTS

| | | |
|---|---|---|
| CN | 206194755 | 5/2017 |
| CN | 208538872 U | 2/2019 |
| CN | 110137283 A | 8/2019 |
| CN | 209709005 U | 11/2019 |
| CN | 110629290 A | 12/2019 |
| CN | 111146313 | 5/2020 |
| CN | 111146313 A | 5/2020 |
| CN | 112466968 | 3/2021 |
| JP | H08-162652 A | 6/1996 |
| JP | H10-313128 A | 11/1998 |
| JP | 3493951 | 2/2004 |
| JP | 2011-009733 | 1/2011 |
| JP | 2014-135343 A | 7/2014 |
| JP | 2019-054121 A | 4/2019 |

OTHER PUBLICATIONS

Chinese Office Action for Application No. 202011296656.4, mailed Aug. 18, 2022 (15 pages).
Chinese Office Action for Application No. 202011296656.4, mailed Apr. 30, 2024 (7 pages).
Japanese Office Action for App. No. 2023-530005, mailed Mar. 1, 2024 (12 pages) [English Translation].
Extended European Search Report (Application No. 21893968.4) mailed Nov. 15, 2024. pp. 1-9, Feb. 22, 2025.
Serra H. Altinoluk et al. "Light Trapping by Micro and Nano-hole Texturing of Single-Crystalline Silicon Solar Cells", 6th International Conference on Silicon Photovoltaics, SiliconPV 2016, Energy Procedia 92, 2016, pp. 291-296.
Kung Pung et al., "Manipulations of Light by Ordered Mirco-holes in Silicon Substrates", Optics Express, May 25, 2020, vol. 28, No. 11, pp. 16151-161612.

* cited by examiner

Prepare a textured structure on at least one surface of a cell body, the textured structure being composed of pyramid and/or inverted pyramid structures distributed along one surface of the cell body — 101

Prepare a plurality of micron-scale pits on the surface of the cell body — 102

PHOTOVOLTAIC CELL AND PHOTOVOLTAIC MODULE

CROSS-REFERENCE TO RELATED APPLICATION

The present application claims the benefit of priority to Chinese patent application No. 202011296656.4 filed with the China National Intellectual Property Administration on Nov. 18, 2020, titled "PHOTOVOLTAIC CELL AND PHOTOVOLTAIC MODULE", the contents of which are incorporated herein by reference in their entireties.

TECHNICAL FIELD

The present disclosure relates to the field of solar cells, in particular to a photovoltaic cell, a preparation method and a photovoltaic module.

BACKGROUND

Since traditional energy sources are continuously consumed and have negative impact on the environment, solar energy, which is a pollution-free and renewable energy, has been developed and utilized rapidly, especially photovoltaic cells with high conversion efficiency have become the focus of current research.

At present, in order to reduce the reflection of sunlight on the surface of the photovoltaic cell, a texturing process may be used to prepare pyramid and/or inverted pyramid-shaped textured structures on the surface of the photovoltaic cell, so that the photovoltaic cell can absorb more sunlight for photoelectric conversion, and the conversion efficiency of the photovoltaic cell is improved. Such structure has a good anti-reflection effect for direct light or light with a small incident angle. However, for light with a large incident angle, a large portion of the light, after passing through the pyramid and/or inverted pyramid-shaped textured structures on the surface of the photovoltaic cell, will be reflected from the surface of the photovoltaic cell back to the air, and will not participate in the photoelectric conversion of the photovoltaic cell. In the related art, a nanoscale light-trapping structure can be prepared on the surface of the photovoltaic cell through a black silicon process. The nanoscale light-trapping structure has a better light-trapping effect on the light with a large incident angle, thereby improving the photoelectric conversion efficiency of the photovoltaic cell.

However, in the current solution, since the nano scale light-trapping structure greatly increases the surface area of the monocrystalline silicon in the photovoltaic cell, it is hard to generate a uniform passivation layer on the nanostructure, the recombination rate of non-equilibrium carriers on the surface will increase, which will reduce the photoelectric conversion efficiency of the photovoltaic cell.

SUMMARY

The present disclosure provides a photovoltaic cell and a photovoltaic module.

In a first aspect, an embodiment of the present disclosure provides a photovoltaic cell, including:
  a cell body;
  at least one surface of the cell body includes a first region and a second region;
  the first region is configured as a textured structure;
  the second region is configured as a plurality of pits;
  a projection size of each of the pits on the surface of the cell body is 0.5 to 100 microns;
  a deviation angle between a sidewall of each of the pits and a thickness direction of the cell body is less than 15 degrees.

Optionally, the projection size of each of the pits on the surface of the cell body is 1 to 20 microns.

Optionally, the plurality of pits are distributed in an array on the surface of the cell body; and a space between adjacent pits is 2 to 200 microns.

Optionally, a ratio of the projection area of the pits on the surface of the cell body to a surface area of the cell body is 0.4 to 0.85.

Optionally, a depth of each of the pits is greater than or equal to 0.1 micron.

Optionally, the pits include any one or more of round holes, rectangular holes or irregular shapes.

Optionally, the cell body includes a first electrode; and the first electrode is at least partially disposed on the textured structure.

Optionally, the photovoltaic cell further includes a passivation layer disposed on the textured structure as well as bottom surfaces and sidewalls of the pits.

Optionally, the first electrode includes a first main grid and a first fine grid, the first main grid is disposed on the textured structure and/or the pits, and the first fine grid is disposed on the textured structure.

In a second aspect, an embodiment of the present disclosure provides a method for preparing the above-mentioned photovoltaic cell.

In a third aspect, an embodiment of the present disclosure provides a photovoltaic module including the above-mentioned photovoltaic cell.

BRIEF DESCRIPTION OF THE DRAWINGS

In order to more clearly illustrate technical solutions of the embodiments of the present disclosure, accompanying drawings used in the embodiments will be briefly introduced below. It should be understood that the following drawings only show some embodiments of the present disclosure, and should not be regarded as limiting the scope. For those skilled in the art, other related drawings may be obtained based on these drawings without paying creative labor.

DETAILED DESCRIPTION OF THE EMBODIMENTS

The technical solutions of the embodiments of the present application will be clearly and thoroughly described below with reference to the accompanying drawings of the embodiments of the present application. Apparently, only a part of the embodiments, not all the embodiments of the present application, are described. All other embodiments obtained, based on the embodiments described in the present application, by those skilled in the art without paying creative efforts shall fall within the protection scope of the present application.

In order to reduce the reflection of incident light on the surface of the photovoltaic cell, improve the absorption effect of incident light, and increase the power generation capacity, the photovoltaic cell is usually designed with a textured structure with pyramid structures and inverted pyramid structures on the surface. The textured structure has a good anti-reflection effect for vertical incident light or incident light with a small incident angle, which can reduce the probability of the incident light with a small angle being reflected out of the photovoltaic cell, while the textured structure has bad effect for incident light with a large incident angle. That is, the omnidirectionality of the photovoltaic cell is not good, and the photovoltaic cell with poor omnidirectionality needs to be disposed at the optimal light receiving angle or use a tracking bracket to achieve a large power generation capacity. Since the optimal light receiving angle changes according to geographical locations, time and seasons, etc., a fixed bracket can not be adjusted in real time so that the photovoltaic cell reaches the optimal light receiving angle, and the tracking bracket is usually expensive. Therefore, a simple manner for increasing the power generation capacity is improving the omnidirectionality of the photovoltaic cell.

A photovoltaic cell and a photovoltaic module provided by the present disclosure will be described in detail below by enumerating several specific embodiments.

Figure 1:
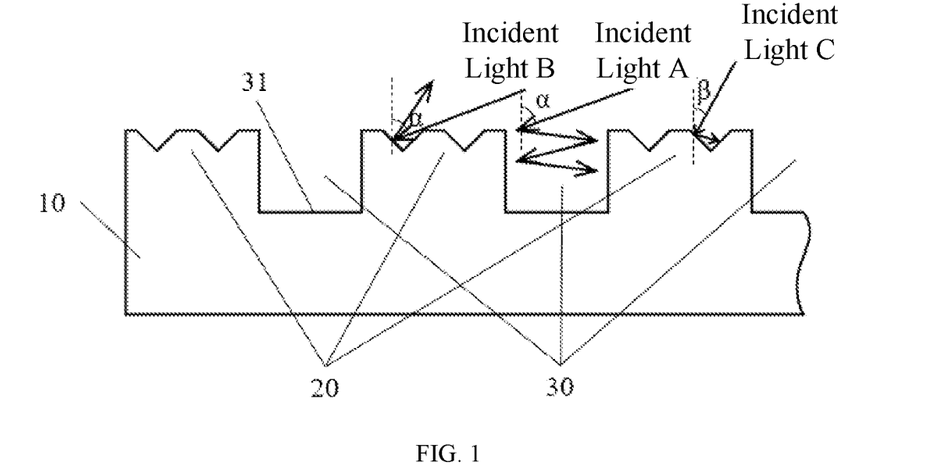
FIG. 1 is a schematic structural diagram illustrating a photovoltaic cell provided by an embodiment of the present disclosure.

Reference is made to FIG. 1, which is a schematic structural diagram illustrating a photovoltaic cell provided by an embodiment of the present disclosure. As shown in FIG. 1, the photovoltaic cell may include a cell body 10, at least one surface of which includes a first region and a second region 30. The first region 20 is configured with a textured structure, and the second region 30 is configured with a plurality of pits 31.

The first region with the textured structure is composed of pyramid and/or inverted pyramid structures distributed along the surface of the cell body. The cell body can be prepared from a monocrystalline silicon wafer. Accordingly, the textured structure is a regular or irregular pyramid and/or inverted pyramid structure prepared on the surface of the monocrystalline silicon wafer through a texturing process. The cell body can also be prepared from a polycrystalline silicon wafer. Accordingly, the textured structure is a regular or irregular pyramid and/or inverted pyramid structure prepared on the surface of the polycrystalline silicon wafer through a texturing process.

In the embodiment of the present disclosure, the surface of the cell body may be a light receiving surface of the cell body, that is, the surface that is directly in contact with the incident light. At the same time, incident light with an incident angle greater than or equal to 45 degrees can be referred to as large-angle incident light. Referring to FIG. 1, the incident angle of the incident light B is $\alpha$, and $\alpha$ is greater than 45 degrees, that is, the incident light B is a large-angle incident light. The incident light B is irradiated on the first region 20 with a textured structure on the surface of the photovoltaic cell, reflected by the pyramid and/or inverted pyramid structures in the textured structure, and emitted in a direction away from the photovoltaic cell after one reflection. Therefore, the incident light B has a very short optical path in the photovoltaic cell, resulting in poor absorption effect of the photovoltaic cell on the incident light B.

Further, incident light with an incident angle less than 45 degrees can be referred to as small-angle incident light. Referring to FIG. 1, the incident angle of the incident light C is $\beta$, and $\beta$ is less than 45 degrees, that is, the incident light C is a small-angle incident light. The incident light C is irradiated on the first region 20 with the textured structure on the surface of the photovoltaic cell, and reflected by the pyramid and/or inverted pyramid structures in the textured structure, it can undergo multiple reflections in the textured structure of the photovoltaic cell. Therefore, the incident light C has a longer optical path in the photovoltaic cell, resulting in better absorption effect of the photovoltaic cell on the incident light C.

As can be seen, the photovoltaic cell with merely the textured structure has a good absorption effect for the small-angle incident light, but has a poor absorption effect for the large-angle incident light. Therefore, the omnidirectionality of the photovoltaic cell is not good. When a photovoltaic module including such photovoltaic cell is installed in an aircraft, an automobile and a building, the photovoltaic cell needs to have the optimum light receiving angle so that the installation position is limited, or a tracking bracket is necessary to achieve a large power generation capacity, resulting in relatively high cost.

In addition, the surface of the cell body of the photovoltaic cell also includes the second region configured with a plurality of pits. The projection size of each of the pits on the surface of the cell body is 0.5 to 100 microns, that is, each of the pits is a micron-scale pit. Further, a deviation angle between the sidewall of the pit and a thickness direction of the cell body is less than 15 degrees, so that the small-angle incident light irradiates into the pit and is reflected for multiple times in the pit.

Referring to FIG. 1, the surface of the cell body 10 of the photovoltaic cell also includes the second region 30 configured with a plurality of micron-scale pits 31, and the deviation angle between the sidewall of the pit 31 and the thickness direction of the cell body 10 is 0 degrees.

The shape of the micron-scale pits 31 can be any one or more of a circular hole, a rectangular hole or an irregular shape. If the shape of the micron-scale pit 31 is a circular hole, then the diameter of the micron-scale pit 31 ranges from 0.5 to 100 microns. If the shape of the micron-scale pit 31 is a rectangular hole or an irregularly shaped deep hole, the length of the diagonal line of the micron-scale pit 31 ranges from 0.5 to 100 microns.

Specifically, the incident light A is also a large-angle incident light with an incident angle $\alpha$. When irradiating a micron-scale pit 31 on the surface of the photovoltaic cell, the incident light A is reflected by the sidewall and the bottom surface of the micron-scale pit 31, and can undergo multiple reflections in the micron-scale pit 31 of the photovoltaic cell. Therefore, the incident light A has a longer optical path in the photovoltaic cell, and the absorption effect of the photovoltaic cell on the incident light A is better.

As can be seen, for a photovoltaic cell with a textured structure and micron-scale pits in the cell body, the textured structure has a better absorption effect for small-angle incident light, and the micron-scale pits can improve the absorption effect of the photovoltaic cell for the small-angle incident light, moreover, micron-sized pits have a good absorption effect for large-angle incident light. Therefore, such photovoltaic cell has high omnidirectionality. When a photovoltaic module including such photovoltaic cell is installed in aircrafts, automobiles and buildings, the photovoltaic cell can have better absorption effect for the incident light without adjusting installation location and using a tracking bracket, thereby improving the photoelectric conversion efficiency of the photovoltaic module, and achieving a greater power generation capacity.

Further, the projection size of the micron-scale pit on the surface of the cell body is 0.5 to 100 microns, that is, the structure size of the micron-scale pit is larger relative to the nanoscale light-trapping structure, which can avoid that the passivation layer cannot be successfully prepared on the smaller nanoscale light-trapping structure, thereby ensuring that a uniform passivation layer can be effectively generated on the surface of the photovoltaic cell. Moreover, the surface area of the photovoltaic cell with micron-scale pits is small, so the specific surface area of the photovoltaic cell can be reduced. Accordingly, the recombination rate of non-equilibrium carriers on the surface of the photovoltaic cell is reduced without affecting the lateral transmission and collection of carriers on the surface of the photovoltaic cell, and the photoelectric conversion efficiency of the photovoltaic cell is ultimately improved.

In the embodiment of the present disclosure, the photovoltaic cell includes a cell body; at least one surface of the cell body includes a first region and a second region; the first region is configured with a textured structure; the second region is configured with a plurality of pits. The projection size of each of the pits on the surface of the cell body is 0.5 to 100 microns; the deviation angle between the sidewall of each of the pits and the thickness direction of the cell body is less than 15 degrees. In the present disclosure, at least one surface of the cell body of the photovoltaic cell includes the first region and the second region, among them, the first region is configured with the textured structure composed of pyramid and/or inverted pyramid structures, for incident light with a small incident angle, the textured structure can reduce the probability of the incident light with a small angle being reflected out of the photovoltaic cell; the second region is configured with a plurality of pits with a projection size of 0.5 to 100 microns on the surface of the cell body, and the deviation angle between the sidewall of the pit and the thickness direction of the cell body is less than 15 degrees, for incident light with a large incident angle, the micron-scale pits on the surface of the photovoltaic cell can reduce the probability of the large-angle incident light being reflected out of the photovoltaic cell, the large-angle incident light is reflected for multiple times in the micron-scale pits, and has a long optical path in the photovoltaic cell, which can improve the absorption effect of the photovoltaic cell on the incident light. Moreover, compared with the nanoscale light-trapping structure, the structure size of the micron-scale pit is larger, and the surface area of the photovoltaic cell with the micron-scale pits is smaller. Therefore, a uniform passivation layer can be effectively formed on the surface of the photovoltaic cell, moreover, the recombination rate of non-equilibrium carriers on the surface of the photovoltaic cell can be reduced, thereby improving the photoelectric conversion efficiency of the photovoltaic cell.

Optionally, the projection size of each of the pits on the surface of the cell body is 1 to microns, so as to ensure that the pits arranged in the second region on the surface of the cell body are relatively uniform and moderate in size.

Figure 2:
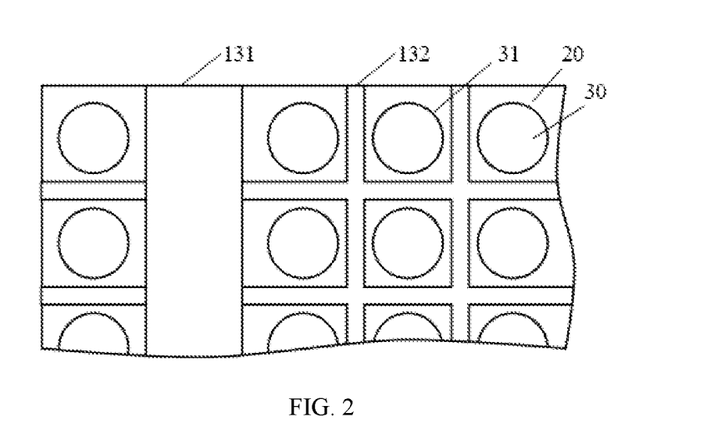
FIG. 2 is a top view of a photovoltaic cell provided by an embodiment of the present disclosure.

Optionally, reference is made to FIG. 2, which is a top view of a photovoltaic cell provided by an embodiment of the present disclosure. As shown in FIG. 2, a plurality of micron-scale pits 31 may be distributed in an array on the surface of the cell body, and an space between adjacent micron-scale pits 31 may be 2 to 200 microns, so that other structures of the photovoltaic cell can be arranged, between adjacent micron-scale pits 31, on the textured structure in the first region 20 to realize the function of the photovoltaic cell.

Optionally, the pits may include any one or more of a circular hole, a rectangular hole, or an irregular shape, so that the incident light are reflected for multiple times when the incident light irradiates on the bottom surface and sidewalls of the micron-scale pit. Referring to FIG. 2, the micron-scale pits 31 are circular holes.

Optionally, a depth of the pit may be greater than or equal to 0.1 micron, and a ratio of the projection area of the micron-scale pits on the surface of the cell body to the surface area of the cell body may be 0.4 to 0.85.

In the embodiment of the present disclosure, the depth of the micron-scale pit and the ratio can be determined according to the specific application scenario of the photovoltaic module including the photovoltaic cell. Specifically, for application scenarios where large-angle incident light accounts for a large proportion, the projection size of the pits on the surface of the cell body can be increased, or the number of the pits can be increased, so that the ratio of the projection area of the pits are on the surface of the cell body to the surface area of the cell body is larger, thereby increasing the absorption effect of the photovoltaic cell for large-angle incident light; for application scenarios where large-angle incident light accounts for less proportion, the projection size of the pits on the surface of the cell body can be reduced, or the number of the pits can be reduced, so that the ratio of the projection area of the pits on the surface of the cell body to the surface area of the cell body is smaller, thereby enabling the photovoltaic cell to have a better absorption effect on the incident light.

Further, when the incident angle of the large-angle incident light is large, the micron-scale pits with a smaller depth can also make the incident light be reflected for multiple times in the micron-scale pits, so the depth of the micron-scale pits can be reduced; when the incident angle of the large-angle incident light is small, only micron-scale pits with a larger depth can ensure multiple reflections of the incident light in the micron-scale pits, thus it is necessary to increase the depth of the micron-scale pits.

Optionally, the cell body may include a first electrode that is at least partially disposed on the textured structure, that is, the first electrode cannot be completely disposed on the micron-scale pits, thereby reducing the filling of the first electrode on the micron-scale pits, avoiding affecting the light trapping function of the micron-scale pits for large-angle reflection light.

Optionally, the photovoltaic cell may further include a passivation layer that is disposed on the textured structure as well as the bottom surfaces and the sidewalls of the pits. Compared with the nanoscale light-trapping structure, the structure size of the micron-scale pits is larger, and the surface area of the photovoltaic cell with the micron-scale pits is small, so a uniform passivation layer can be effectively generated on the surface of the photovoltaic cell, realizing the surface passivation of the photovoltaic cell.

Figure 3:
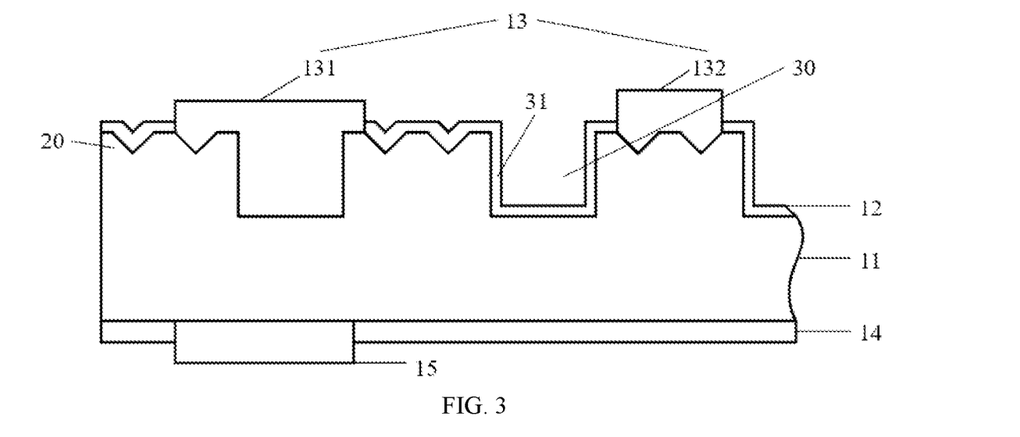
FIG. 3 is a schematic structural diagram illustrating a photovoltaic cell with double-sided electrodes provided by an embodiment of the present disclosure.

Optionally, the photovoltaic cell in the embodiment of the present disclosure may be a photovoltaic cell with double-sided electrodes, such as a passivated emitter and rear cell (PERC). Reference is made to FIG. 3, which is a schematic structural diagram illustrating a photovoltaic cell with double-sided electrodes provided by an embodiment of the present disclosure. As shown in FIG. 3, the cell body includes a silicon wafer substrate 11, a first electrode 13 and a first functional layer 12 arranged on one side of the silicon wafer substrate 11, and a second functional layer 14 and a second electrode 15 arranged on the other side of the silicon wafer substrate 11.

The first functional layer 12 is disposed on the textured structure in the first region 20 and the bottom surfaces and the sidewalls of the pits 31 in the second region 30, and the first functional layer 12 has a first hollow structure where the first electrode 13 is located. The second functional layer 14 is disposed on the other side of the silicon wafer substrate 11, and the second functional layer 14 has a second hollow structure where the second electrode 15 is located.

Specifically, the silicon wafer substrate may be an n-type silicon wafer substrate prepared from an n-type crystalline silicon wafer. The first functional layer may be a multilayer structure, for example, the first functional layer may include 2-nanometer-thick silicon oxide and 70-nanometer-thick silicon nitride, which is respectively used for surface passivation and antireflection on one side of the photovoltaic cell. The second functional layer may also be a multilayer structure, for example, the second functional layer may include 2-nanometer-thick silicon oxide, 15-nanometer-thick aluminum oxide, and 50-nanometer-thick silicon nitride, thereby realizing the surface passivation and antireflection function on the other side of the photovoltaic cell.

Further, the first electrode is provided on one side of the silicon wafer substrate, and the second electrode is provided on the other side of the silicon wafer substrate, thereby forming a photovoltaic cell with double-sided electrodes. Specifically, a mask may be used to prepare the first hollow structure on the first functional layer, and the first electrode is located at the first hollow structure, so that the first electrode may be disposed on the textured structure or in the pits. Further, a mask may be used to prepare the second hollow structure on the second functional layer, and the second electrode is located at the second hollow structure, so that the second electrode is disposed on the other side of the silicon wafer substrate.

Optionally, referring to FIG. 3, the first electrode 13 may include a first main grid 131 and a first fine grid 132, among them, the first main grid 131 may be disposed on the textured structure in the first region 20 and/or the pits 31 in the second region 30, and the first fine grid 132 may be disposed on the textured structure.

Specifically, for photovoltaic cells, the main function of the first fine grid(s) is to collect the current generated by a photovoltaic cell and transfer the current to the first main grid(s), so that multiple photovoltaic cells can use the first main grids to gather the current generated by the multiple photovoltaic cells, and transfer the current to a junction box to provide power to external equipment. There is a large quantity of first fine grids and the first fine grid is relatively small in width, thus referring to FIG. 2, the first fine grids 132 can be disposed on the textured structure between adjacent pits 31. On the contrary, there are a little quantity of first main grids and the first main grid is relatively large in width, thus the first main grid 131 can be disposed in the pit 31, or disposed on the textured structure between adjacent pits 31, or disposed both in the pit 31 and on the textured structure, so that the structure of the photovoltaic cell is more compact, and the photoelectric conversion efficiency of the photovoltaic cell is improved.

Figure 4:
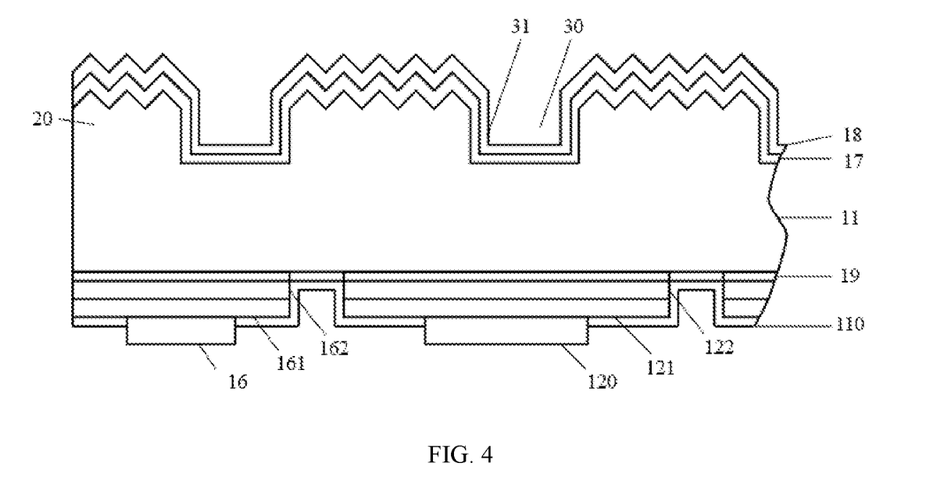
FIG. 4 is a schematic structural diagram illustrating a photovoltaic cell with single-sided electrodes provided by an embodiment of the present disclosure.

Optionally, the photovoltaic cell in the embodiment of the present disclosure may be a photovoltaic cell with single-sided electrodes, for example a tunnel oxide passivated contact (TOPCon) cell, a polycrystalline silicon on oxide passivating contact (POLO) cell, an interdigitated back contact (IBC) cell, a silicon heterojunction (SHJ) cell. Reference is made to FIG. 4, which is a schematic structural diagram illustrating a photovoltaic cell with single-sided electrodes provided by an embodiment of the present disclosure, as shown in FIG. 4, the cell body includes: a silicon wafer substrate 11; a first passivation layer 17 and a third functional layer 18 disposed on a side of the silicon wafer substrate 11; and a second passivation layer 19, a fourth functional layer 110, a third electrode 16 and a fourth electrode 120 disposed on the other side of the silicon wafer substrate 11.

The textured structure in the first region 20 is disposed on one surface of the silicon wafer substrate 11, the bottom surfaces of the pits 31 are arranged in the silicon wafer substrate. The first passivation layer 17 is disposed on the textured structure as well as the bottom surfaces and sidewalls of the pits 31, and the third functional layer 18 is disposed on a side of the first passivation layer 17 facing away from the silicon wafer substrate 11. The second passivation layer 19 is disposed on the other side of the silicon wafer substrate 11, and the fourth functional layer 110 is disposed on a side of the second passivation layer 19 facing away from the silicon wafer substrate 11. The fourth functional layer 110 has a third hollow structure, and the third electrode 16 and the fourth electrode 120 are alternatively arranged in the third hollow structure.

Specifically, the silicon wafer substrate may be an n-type silicon wafer substrate prepared from an n-type crystalline silicon wafer; the first passivation layer can be amorphous silicon or silicon oxide, so as to achieve a surface passivation on one side of the photovoltaic cell; the third functional layer may be a multi-layer structure, for example, a multi-layer silicon nitride structure with a total thickness of 70 nanometers, so as to achieve a surface field passivation and anti-reflection function on one side of the photovoltaic cell; the second passivation layer may be amorphous silicon or silicon oxide, so as to achieve a surface passivation on the other side of the photovoltaic cell; and the fourth functional layer can achieve the surface field passivation and anti-reflection function on the other side of the photovoltaic cell.

Further, the third electrode and the fourth electrode are provided on the other side of the silicon wafer substrate, thereby forming a photovoltaic cell with single-sided electrodes. Specifically, a mask is used to prepare the third hollow structure on the fourth functional layer, so that the third electrode and the fourth electrode are alternatively arranged in the third hollow structure.

Optionally, referring to FIG. 4, a first collection layer 162 and a first transport layer 161 are arranged between the third electrode 16 and the second passivation layer 19, the first collection layer 162 being disposed on a side of the second passivation layer 19 facing away from the silicon wafer substrate 11, the first transport layer 161 being disposed on a side of the first collection layer 162 facing away from the second passivation layer 19; a second collection layer 122 and a second transport layer 121 are arranged between the fourth electrode 120 and the second passivation layer 19, the second collection layer 122 being disposed on a side of the second passivation layer 19 facing away from the silicon wafer substrate 11, the second transport layer 121 being disposed on a side of the second collection layer 122 facing away from the second passivation layer 19.

Specifically, when an n-type crystalline silicon wafer is used as the silicon wafer substrate, the first collection layer may be a majority carrier collection region composed of n-type doped amorphous silicon, and the second collection layer may be a minority carrier collection region composed of p-type doped amorphous silicon. The first collection layer and the second collection layer are alternatively arranged on the surface of the second passivation layer on the other side of the silicon wafer substrate. Correspondingly, the first transport layer is a carrier transport layer corresponding to the first collection layer, that is, a majority carrier transport layer, the third electrode is a majority carrier terminal electrode of a photovoltaic cell with single-sided electrodes; the second transport layer is a carrier transport layer corresponding to the second collection layer, that is, a minority carrier transport layer, the fourth electrode is a minority carrier terminal electrode of a photovoltaic cell with single-sided electrodes.

Figure 5:
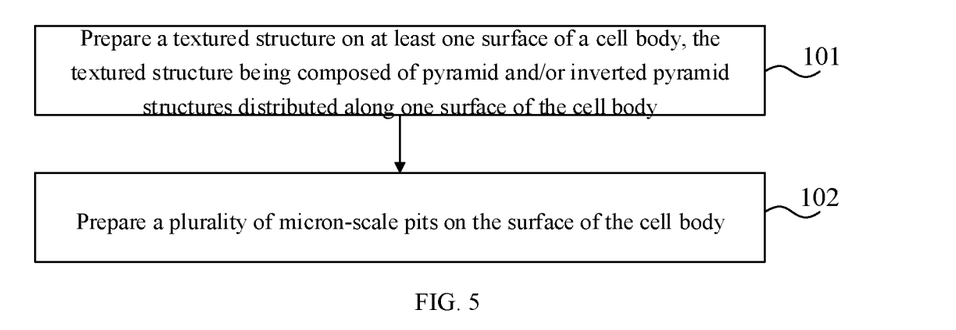
FIG. 5 is a flowchart of a method for preparing a photovoltaic cell provided by an embodiment of the present disclosure.

The present disclosure further provides a method for preparing the above-mentioned photovoltaic cell. Referring to FIG. 5, which is a flow chart of a method for preparing a photovoltaic cell provided by an embodiment of the present disclosure, the method may include steps described below.

At step 101, a textured structure is prepared on at least one surface of a cell body, the textured structure being composed of pyramid and/or inverted pyramid structures distributed along one surface of the cell body.

In this step, the textured structure composed of pyramid and/or inverted pyramid structures can be prepared on the cell body through a texturing process.

Specifically, the textured structure is composed of pyramid and/or inverted pyramid structures continuously distributed along one surface of the cell body. The cell body may be prepared from a monocrystalline silicon wafer. Accordingly, the textured structure is a regular pyramid and/or inverted pyramid structure prepared on one surface of the monocrystalline silicon wafer through a texturing process. Alternatively, the cell body may also be prepared from a polycrystalline silicon wafer. Accordingly, the textured structure is an irregular pyramid and/or inverted pyramid structure prepared on one surface of the polycrystalline silicon wafer through a texturing process.

At step 102, a plurality of micron-scale pits are prepared on the surface of the cell body.

In this step, the photoresist can be coated on the surface of the cell body with the textured structure prepared in the above step, and the photoresist is irradiated with a mask plate with a corresponding pattern being used, then the photoresist at the unshielded position can be removed, thereby forming a corresponding pore structure. Next, a deep reactive ion etching process is used to etch at the positions of the above pores, and form multiple pits, the projection size of the pit on the surface of the cell body being 0.5 to 100 microns, the deviation angle between the sidewall of the pit and the thickness direction of the cell body being less than 15 degrees.

Figure 6:
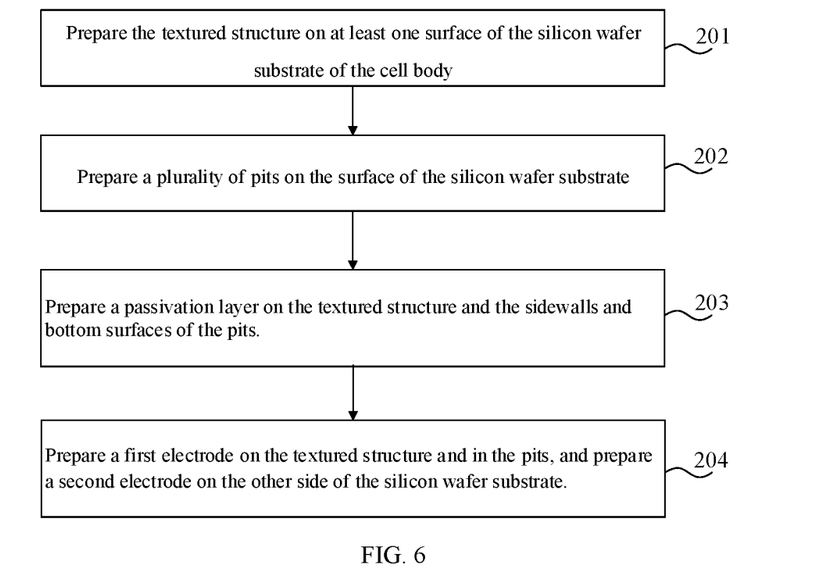
FIG. 6 is a flowchart of a method for preparing a photovoltaic cell with double-sided electrodes provided by an embodiment of the present disclosure.

Reference is made to FIG. 6, which is a flow chart of a method for preparing a photovoltaic cell with double-sided electrodes provided by an embodiment of the present disclosure, the method may include steps described below.

At step 201, the textured structure is prepared on at least one surface of the silicon wafer substrate of the cell body.

In this step, the silicon wafer substrate may be an n-type silicon wafer substrate prepared from an n-type crystalline silicon wafer, the thickness of the silicon wafer substrate can be 150 microns, or an ultra-thin crystalline silicon wafer with a thickness of 10 to 50 microns, or a crystalline silicon wafer with a medium thickness of 50 to 100 microns, and the silicon wafer substrate can be monocrystalline or polycrystalline.

Further, the textured structure composed of pyramid and/or inverted pyramid structures can be prepared on at least one surface of the silicon wafer substrate through a texturing process.

At step 202, a plurality of pits is prepared on the surface of the silicon wafer substrate.

In this step, the photoresist can be coated on the surface of the silicon wafer with the textured structure prepared in the above step, and the photoresist is irradiated with a mask plate with a corresponding pattern being used, then the photoresist at the unshielded position can be removed, thereby forming a corresponding pore structure. Next, a deep reactive ion etching process is used to etch at the positions of the above pores, and form multiple pits, the projection size of the pit on the surface of the cell body being 0.5 to 100 microns, the deviation angle between the sidewall of the pit and the thickness direction of the cell body being less than 15 degrees.

Specifically, the pit may have a circular hole structure with an average aperture of 5 microns, a distance between adjacent pits is 15 microns, and the depth is 0.5 microns.

Moreover, after multiple pits are prepared on the surface of the silicon wafer substrate with the textured structure, a layered PN junction structure layer can be prepared by diffusion on the surface of the textured structure and the sidewalls and bottom surfaces of the pits to separate the carriers.

At step 203, a passivation layer is prepared on the textured structure and the sidewalls and bottom surfaces of the pits.

In this step, the passivation layer can be deposited on the textured structure as well as the sidewalls and bottom surfaces of the pits, for example, the passivation layer can include 2-nanometer-thick silicon oxide, achieving a surface passivation function on one side of the photovoltaic cell.

Further, 70-nanometer-thick silicon nitride can be prepared on the passivation layer to realize the function of anti-reflection on one side of the photovoltaic cell, and the 2-nanometer-thick silicon oxide and the 70-nanometer-thick silicon nitride form a first functional layer with a multilayer structure.

At step 204, a first electrode is prepared on the textured structure and in the pits, and a second electrode is prepared on the other side of the silicon wafer substrate.

In this step, the first electrodes can be prepared on the textured structure and in the pits.

Specifically, a mask may be used to prepare a first hollow structure on the first functional layer, and the first electrode is located at the first hollow structure, so that the first electrode may be disposed on the textured structure or in the pits.

Further, the second functional layer can be deposited on the other side of the silicon wafer substrate, and the second functional layer can be a multilayer structure, for example, the second functional layer can include 2-nanometer-thick silicon oxide, 15-nanometer-thick aluminum oxide, and 50-nanometer-thick silicon nitride, thereby realizing the functions of surface passivation and anti-reflection on the other side of the photovoltaic cell.

Further, the second electrode is prepared on the other side of the silicon wafer substrate. Specifically, a mask may be used to prepare a second hollow structure on the second functional layer, and the second electrode is located at the second hollow structure, so that the second electrode is disposed on the other side of the silicon wafer substrate.

Figure 7:
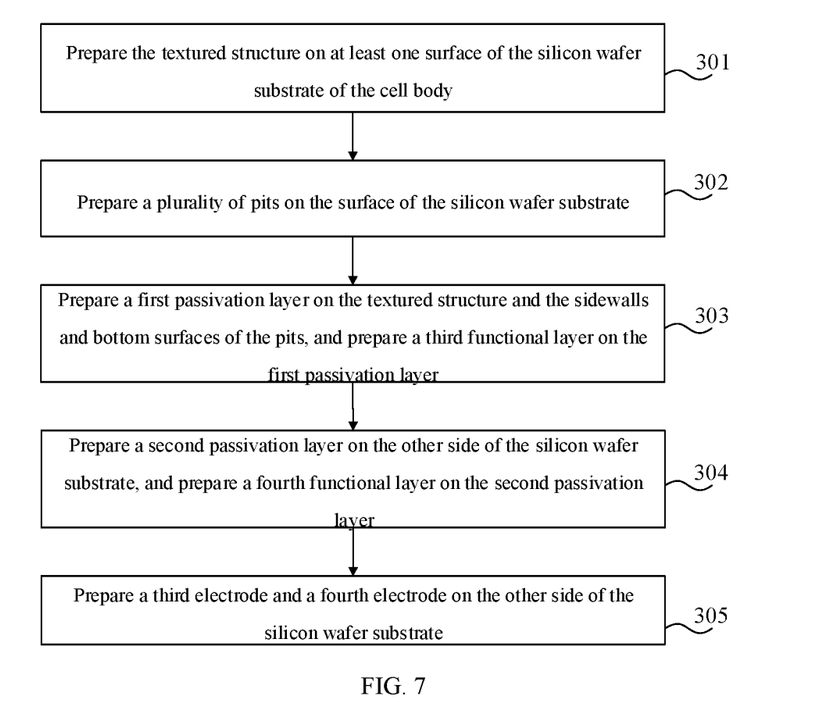
FIG. 7 is a flowchart of a method for preparing a photovoltaic cell with single-sided electrodes provided by an embodiment of the present disclosure.

Optionally, referring to FIG. 7, which is a flow chart of a method for preparing a photovoltaic cell with single-sided electrodes provided by an embodiment of the present disclosure, the method may include steps described below.

At step 301, the textured structure is prepared on at least one surface of the silicon wafer substrate of the cell body.

In this step, the silicon wafer substrate may be an n-type silicon wafer substrate prepared from n-type crystalline silicon wafer, and the thickness of the silicon wafer substrate may be 100 microns.

Further, the textured structure composed of continuously distributed pyramid and/or inverted pyramid structures can be prepared on at least one surface of the silicon wafer substrate through a texturing process.

At step 302, a plurality of pits is prepared on the surface of the silicon wafer substrate.

In this step, a deep hole with a certain depth can be formed, through a laser ablation process, on the surface of the silicon wafer substrate with the textured structure prepared in the above step, the deep holes can be chemically polished after the laser ablation process to obtain smooth sidewalls and bottom surfaces, thereby preparing multiple pits, the projection size of the pit on the surface of the cell body being 0.5 to 100 microns, the deviation angle between the sidewall of the pit and the thickness direction of the cell body being less than 15 degrees.

Specifically, the pits may have a circular hole structure with an average aperture of 2 microns, a distance between adjacent pits is 5 microns, and the depth is 1 microns.

At step 303, a first passivation layer is prepared on the textured structure and the sidewalls and bottom surfaces of the pits, and a third functional layer is prepared on the first passivation layer.

In this step, the first passivation layer can be prepared on the textured structure as well as the sidewalls and bottom surfaces of the pits, the first passivation layer being amorphous silicon or silicon oxide, thereby realizing the function of surface passivation on one side of the photovoltaic cell.

Further, the third functional layer can be prepared on the first passivation layer, the third functional layer being a multilayer structure, for example, a multilayer silicon nitride structure with a total thickness of 70 nanometers, thereby realizing the functions of surface field passivation and anti-reflection on one side of the photovoltaic cell.

At step 304, a second passivation layer is prepared on the other side of the silicon wafer substrate, and a fourth functional layer is prepared on the second passivation layer.

In this step, the second passivation layer can be prepared on the other side of the silicon wafer substrate, the second passivation layer can also be amorphous silicon or silicon oxide, thereby realizing the function of surface passivation on the other side of the photovoltaic cell.

Further, the fourth functional layer can be prepared on the second passivation layer, and the fourth functional layer can realize the functions of surface field passivation and anti-reflection on the other side of the photovoltaic cell.

At step 305, a third electrode and a fourth electrode are prepared on the other side of the silicon wafer substrate.

In this step, the third electrode and the fourth electrode may be provided on the other side of the silicon wafer substrate, thereby forming a photovoltaic cell with single-sided electrodes. Specifically, a mask plate may be used to prepare a third hollow structure on the fourth functional layer, so that the third electrode and the fourth electrode are alternatively arranged in the third hollow structure.

In the embodiment of the present disclosure, a first collection layer and a first transport layer may be arranged between the third electrode and the second passivation layer, the first collection layer being disposed on a side of the second passivation layer facing away from the silicon wafer substrate, the first transport layer being disposed on a side of the first collection layer facing away from the second passivation layer; a second collection layer and a second transport layer are arranged between the fourth electrode and the second passivation layer, the second collection layer being disposed on a side of the second passivation layer facing away from the silicon wafer substrate, the second transport layer being disposed on a side of the second collection layer facing away from the second passivation layer.

Specifically, when an n-type crystalline silicon wafer is used as the silicon wafer substrate, the first collection layer may be a majority carrier collection region composed of n-type doped amorphous silicon, the second collection layer may be a minority carrier collection region composed of p-type doped amorphous silicon. The first collection layer and the second collection layer are alternately arranged on the surface of the second passivation layer on the other side of the silicon wafer substrate, a ratio of the projection area of the first collection layer on the second passivation layer to that of the second collection layer may be 5% to 45%, and an electrical isolation gap is provided between the first collection layer and the second collection layer. Correspondingly, the first transport layer is a carrier transport layer corresponding to the first collection layer, that is, the majority carrier transport layer, and the third electrode is a majority carrier terminal electrode of a photovoltaic cell with single-sided electrodes; the second transport layer is a carrier transport layer corresponding to the second collection layer, that is, the minority carrier transport layer, and the fourth electrode is the minority carrier terminal electrode of the photovoltaic cell with single-sided electrodes. In addition, the first collection layer and the second collection layer may also use doped polysilicon material.

It should be noted that, for the sake of simple description, the method embodiment is expressed as a series of action combinations, but those skilled in the art should know that the embodiment of the present disclosure is not limited by the described action order, according to the embodiments of the present disclosure, certain steps may be performed in other orders or simultaneously. Moreover, those skilled in the art should also know that the embodiments described in the specification are all preferred embodiments, and the actions involved are not necessarily required by the embodiments of the present disclosure.

In addition, the present disclosure further provides a photovoltaic module composed of the above photovoltaic cells.

It should be noted that, the terms "comprising", "including" or any other variation thereof as used herein are intended to cover a non-exclusive inclusion, such that a process, method, article or apparatus including a set of elements includes not only those elements, but also other elements not expressly listed, or elements inherent in the process, method, article, or apparatus. Without further limitations, an element defined by the phrase "comprising a . . . " does not preclude the presence of additional identical elements in the process, method, article, or apparatus including that element.

The embodiments of the present disclosure have been described above in conjunction with the accompanying drawings, but the present disclosure is not limited to the above-mentioned specific implementations, which are only illustrative and not restrictive. Under the inspiration of the present disclosure, those skilled in the art can also make many forms without departing from the purpose of the present disclosure and the protection scope of the claims, all of which belong to the protection of the present disclosure.

The invention claimed is:

1. A photovoltaic cell, comprising:
   a cell body;
   wherein at least one surface of the cell body comprises a first region and a second region that are not overlapped with each other;
   the first region is configured with a textured structure, wherein the textured structure is composed of pyramid and/or inverted pyramid structures;
   the second region is configured with a plurality of pits that are disposed separately;
   a projection size of each of the pits on the surface of the cell body is 0.5 to 100 microns;
   a deviation angle between a sidewall of each of the pits and a thickness direction of the cell body is less than 15 degrees.

2. The photovoltaic cell according to claim 1, wherein the projection size of each of the pits on the surface of the cell body is 1 to 20 microns.

3. The photovoltaic cell according to claim 1, wherein the plurality of pits are distributed in an array on the surface of the cell body; and
   a space between adjacent pits is greater than or equal to 2 microns, and less than or equal to 200 microns.

4. The photovoltaic cell according to claim 1, wherein a ratio of the projection area of the pits on the surface of the cell body to a surface area of the cell body is 0.4 to 0.85.

5. The photovoltaic cell according to claim 1, wherein a depth of each of the pits is greater than or equal to 0.1 microns.

6. The photovoltaic cell according to claim 1, wherein the pits comprise any one or more of round holes, rectangular holes or irregular shapes.

7. The photovoltaic cell according to claim 1, wherein the cell body comprises a first electrode;
   wherein the first electrode is at least partially disposed on the textured structure.

8. The photovoltaic cell according to claim 7, further comprising a passivation layer disposed on the textured structure as well as bottom surfaces and sidewalls of the pits.

9. The photovoltaic cell according to claim 7, wherein the first electrode comprises a first main grid and a first fine grid, the first main grid is disposed on at least one of the textured structure and the pits, and the first fine grid is disposed on the textured structure.

10. The photovoltaic cell according to claim 1, wherein the photovoltaic cell is a photovoltaic cell with single-sided electrodes, and the cell body comprises: a silicon wafer substrate; a first passivation layer and a second passivation layer that are disposed on opposite sides of the silicon wafer substrate; two functional layers disposed on opposite sides of the silicon wafer substrate; and two electrodes, wherein the two electrodes and the second passivation layer are disposed the same side of the silicon wafer substrate.

11. The photovoltaic cell according to claim 10, wherein a first collection layer and a first transport layer are arranged between one of the two electrodes and the second passivation layer, the first collection layer is disposed on a side of the second passivation layer facing away from the silicon wafer substrate, and the first transport layer is disposed on a side of the first collection layer facing away from the second passivation layer;
   a second collection layer and a second transport layer are arranged between the other one of the two electrodes and the second passivation layer, the second collection layer is disposed on the side of the second passivation layer facing away from the silicon wafer substrate, and the second transport layer is disposed on a side of the second collection layer facing away from the second passivation layer.

12. A method for preparing a photovoltaic cell according to claim 1, comprising:
   preparing a textured structure on at least one surface of a cell body, the textured structure being composed of pyramid and/or inverted pyramid structures distributed along one surface of the cell body; and
   preparing a plurality of micron-scale pits on the surface of the cell body.

13. The method according to claim 12, wherein the preparing a textured structure on at least one surface of a cell body comprises:
   preparing the textured structure on at least one surface of a silicon wafer substrate of the cell body.

14. The method according to claim 13, wherein the preparing a plurality of micron-scale pits on the surface of the cell body comprises:
   preparing the plurality of pits on the surface of the silicon wafer substrate.

15. The method according to claim 12, further comprising:
   preparing a passivation layer on the textured structure as well as sidewalls and bottom surfaces of the pits.

16. The method according to claim 12, further comprising:
   preparing a first electrode on the textured structure and in the pits, and preparing a second electrode on the other side of the silicon wafer substrate.

17. A method for preparing a photovoltaic cell with single-sided electrodes, comprising:
   preparing a textured structure on at least one surface of a silicon wafer substrate of a cell body;
   preparing a plurality of pits on the surface of the silicon wafer substrate;
   preparing a first passivation layer on the textured structure and sidewalls and bottom surfaces of the pits, and preparing a third functional layer on the first passivation layer;
   preparing a second passivation layer on the other side of the silicon wafer substrate, and preparing a fourth functional layer on the second passivation layer; and
   preparing a third electrode and a fourth electrode on the other side of the silicon wafer substrate.

18. A photovoltaic module comprising the photovoltaic cell according to claim 1.

* * * * *